(12) United States Patent
Bogin et al.

(10) Patent No.: US 6,181,619 B1
(45) Date of Patent: *Jan. 30, 2001

(54) SELECTIVE AUTOMATIC PRECHARGE OF DYNAMIC RANDOM ACCESS MEMORY BANKS

(75) Inventors: Zohar Bogin, Folsom; Vincent VonBokern, Rescue; David Freker, Folsom, all of CA (US)

(73) Assignee: Intel Corporation, Santa Clara, CA (US)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/205,508

(22) Filed: Dec. 4, 1998

(51) Int. Cl.[7] .................................................. G11C 7/00
(52) U.S. Cl. ...................................... 365/203; 365/230.03
(58) Field of Search ............................. 365/203, 230.03, 365/238.5

(56) References Cited

U.S. PATENT DOCUMENTS

| | | | |
|---|---|---|---|
| 5,721,860 | * 2/1998 | Stolt | 365/230.01 |
| 5,825,710 | * 10/1998 | Jeng et al. | 365/230.03 |
| 5,889,714 | * 3/1999 | Schumann et al. | 365/203 |
| 5,914,903 | * 6/1999 | Kanma et al. | 365/203 |
| 5,923,603 | * 7/1999 | Pinney | 365/203 |
| 5,940,848 | * 8/1999 | Bains | 365/203 X |
| 5,950,219 | * 9/1999 | Rao | 365/203 X |
| 5,963,468 | * 10/1999 | Rao | 365/203 X |
| 5,963,497 | * 10/1999 | Holland | 365/203 X |

* cited by examiner

*Primary Examiner*—A Zarabian
(74) *Attorney, Agent, or Firm*—Blakely, Sokoloff, Taylor & Zafman LLP

(57) ABSTRACT

A method and apparatus for selective automatic precharge of dynamic random access memory banks is disclosed. By automatically precharging memory banks under certain conditions overall memory throughput can be improved because precharging is performed on a more selective basis. In one embodiment, the present invention provides support for multiple open banks of memory within a single memory sub-system. When multiple banks of memory are open simultaneously, a bank of memory that is less likely to be accessed in the future can be precharged when a new bank of memory is to be opened to service a memory request.

20 Claims, 5 Drawing Sheets

US 6,181,619 B1

SELECTIVE AUTOMATIC PRECHARGE OF DYNAMIC RANDOM ACCESS MEMORY BANKS

FIELD OF THE INVENTION

The present invention relates to control of random access memory. More particularly, the present invention relates to selective automatic precharge of dynamic random access memory based on predetermined criteria.

BACKGROUND OF THE INVENTION

Typical dynamic random access memory (DRAM) controllers follow a specific sequence to access a memory location. This sequence includes activating or opening a bank of memory, accessing (e.g., reading or writing) a memory location in the bank of memory, and closing or precharging the bank of memory. Generally, each step of the sequence is the result of an individual explicit command. When multiple memory locations within a single bank of memory are accessed, the activation and precharging steps can be performed once for the group of accesses to the bank of memory.

Many computer systems have multitasking capabilities that allow the computer system to maintain multiple active processes. Because processes often access memory locations within a common bank of memory, the activation and precharging steps can be performed sparingly for a single process. When multiple processes are active, however, each process has a location in memory that can be repeatedly accessed. Thus, the activation and precharging of DRAM banks are often included in context switching overhead.

What is needed is a method and apparatus that reduces the number of precharge operations in a memory sub-system having multiple banks.

SUMMARY OF THE INVENTION

A method and apparatus for selective automatic precharge of dynamic random access memory banks is described. A bank of memory in a memory sub-system is opened. A memory location in the bank of memory is accessed. The bank of memory is precharged automatically based, at least in part, on a predetermined bank closure policy.

BRIEF DESCRIPTION OF THE DRAWINGS

The present invention is illustrated by way of example, and not by way of limitation in the figures of the accompanying drawings in which like reference numerals refer to similar elements.

DETAILED DESCRIPTION

Figure 1:
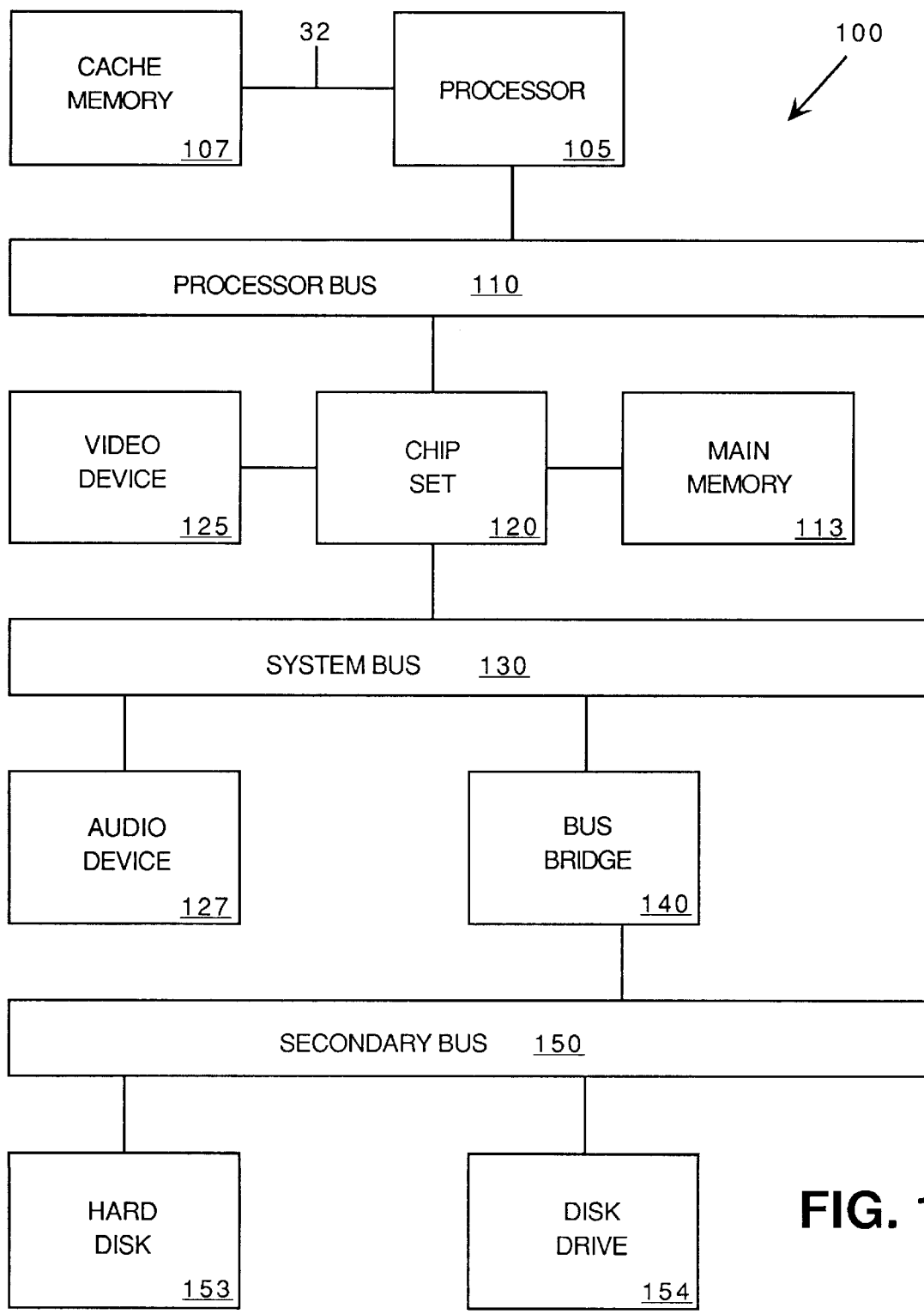
FIG. 1 is a block diagram of a computer system suitable for use with the present invention.

A method and apparatus for selective automatic precharge of dynamic random access memory banks is described. In the following description, for purposes of explanation, numerous specific details are set forth in order to provide a thorough understanding of the present invention. It will be apparent, however, to one skilled in the art that the present invention can be practiced without these specific details. In other instances, structures and devices are shown in block diagram form in order to avoid obscuring the present invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

The present invention provides a method and apparatus for selective automatic precharge of dynamic random access memory banks. By precharging memory banks under certain conditions overall memory throughput can be improved because automatic precharging is performed on a more selective basis than would otherwise occur. In one embodiment, the present invention provides support for multiple open banks of memory within a single memory sub-system. When multiple banks of memory are open simultaneously, a bank of memory that is less likely to be accessed in the future can be precharged when a new bank of memory is to be opened to service a memory request.

In general, automatic precharge of memory banks provides the advantage that two operations can be performed in response to a single command. Under certain conditions automatic precharge can reduce latency and thereby increase throughput. In the following example memory commands require two clock cycles to complete. A first access to row1, bank1, page1 is performed with an automatic precharge. Because the automatic precharge is used for the access, the memory command bus is available two cycles sooner than if an explicit precharge command were issued.

A second access is unrelated to the first access and is to row2, bank2, page2. Because the memory command bus is available two cycles earlier than with explicit precharge commands, the latency associated with the second access is reduced by two clock cycles. A third access to row1, bank1, page2 can similarly begin earlier than otherwise possible because row1, bank1 has been precharged as a result of the first access.

Automatic precharge as a general policy for memory accesses, however, suffer from the disadvantage that an unnecessarily large number of precharges may occur when a bank of memory can remain open for subsequent accesses. Therefore, the present invention provides selective use of precharge and automatic precharge commands based, at least in part, on the type of memory access. In other words, the present invention utilizes a selective automatic precharge policy based, at least in part, on the memory operations performed. In one embodiment, automatic precharge operations are used in a way to benefit more latency sensitive accesses (e.g., processor reads) over less latency sensitive accesses (e.g., I/O device accesses).

FIG. 1 is one embodiment of a computer system suitable for use with the present invention. Computer system 100 includes processor 105 coupled to processor bus 110. In one embodiment, processor 105 is a processor in the Pentium® family of processors including the Pentium® II family and mobile Pentium® and Pentium® II processors available from Intel Corporation of Santa Clara, Calif. Alternatively, other processors may be used. Processor 105 may include a first level (L1) cache memory (not shown in FIG. 1).

In one embodiment, processor 105 is also coupled to cache memory 107, which is a second level (L2) cache memory, via dedicated cache bus 102. The L1 and L2 cache memories can also be integrated into a single device. Alternatively, cache memory 107 may be coupled to processor 105 by a shared bus. Cache memory 107 is optional and is not required for computer system 100.

Chip set 120 is also coupled to processor bus 110. In one embodiment, chip set 120 is the 440BX chip set available from Intel Corporation; however, other chip sets can also be used. Main memory 113 is coupled to processor bus 110 through chip set 120. Main memory 113 and cache memory 107 store sequences of instructions that are executed by processor 105. In one embodiment, main memory 113 includes dynamic random access memory (DRAM); however, main memory 113 may have other configurations. The sequences of instructions executed by processor 105 may be retrieved from main memory 113, cache memory 107, or any other storage device.

Additional devices may also be coupled to processor bus 110, such as multiple processors and/or multiple main memory devices. Computer system 100 is described in terms of a single processor; however, multiple processors can be coupled to processor bus 110. In one embodiment, a digital signal processor (not shown in FIG. 1) is coupled to processor bus 110. Video device 125 is also coupled to chip set 120. In one embodiment, video device includes a video monitor such as a cathode ray tube (CRT) or liquid crystal display (LCD) and necessary support circuitry.

Processor bus 110 is coupled to system bus 130 by chip set 125. In one embodiment, system bus 130 is a Peripheral Component Interconnect (PCI) standard bus; however, other bus standards may also be used. Multiple devices, such as audio device 127, may be coupled to system bus 130.

Bus bridge 140 couples system bus 130 to secondary bus 150. In one embodiment, secondary bus 150 is an Industry Standard Architecture (ISA) bus; however, other bus standards may also be used, for example Extended Industry Standard Architecture (EISA). Multiple devices, such as hard disk 153 and disk drive 154 may be coupled to secondary bus 150. Other devices, such as cursor control devices (not shown in FIG. 1), may be coupled to secondary bus 150.

Figure 2:
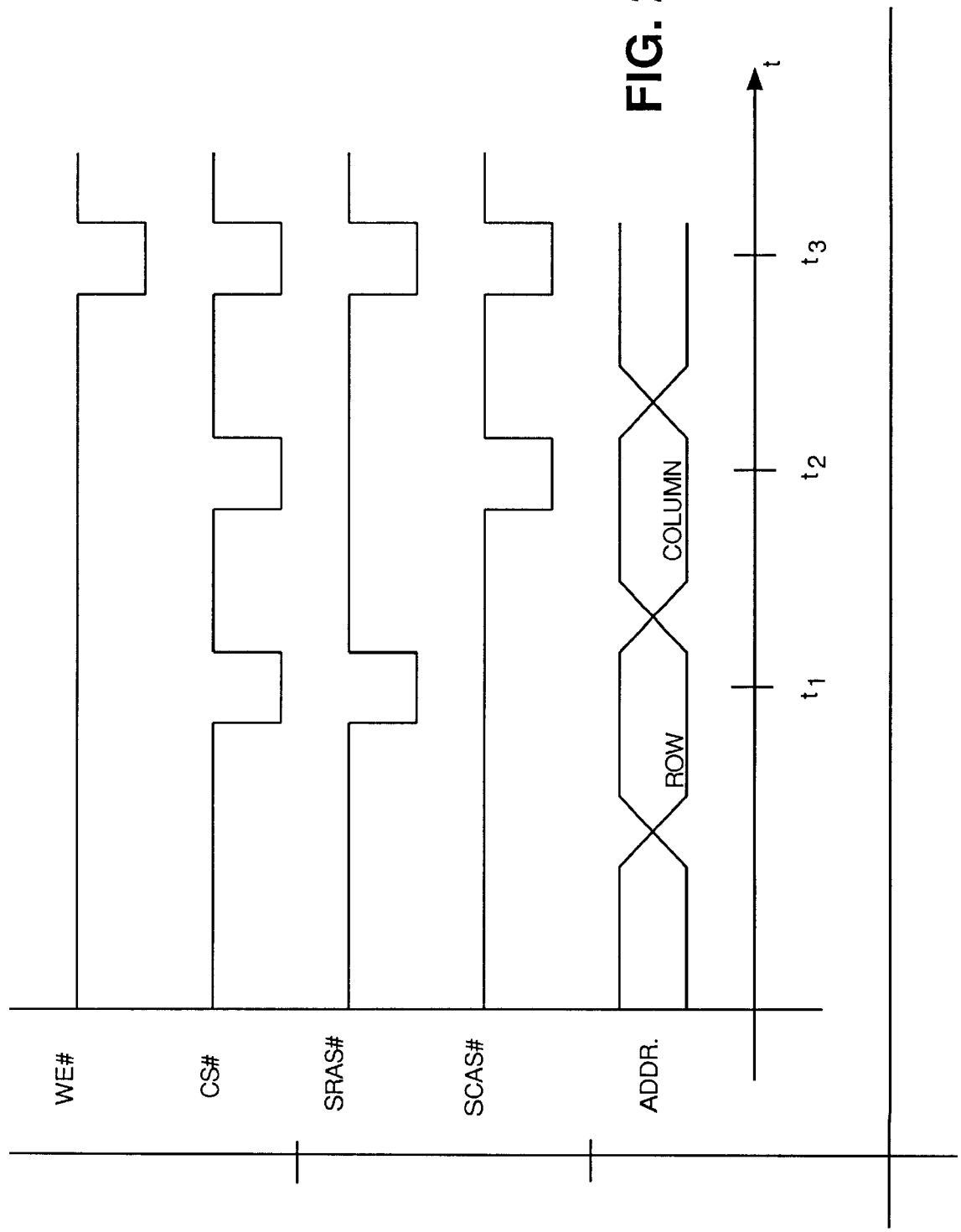
FIG. 2 is a timing diagram of a dynamic random access memory (DRAM) access.

FIG. 2 is a timing diagram of a dynamic random access memory (DRAM) access. The timing diagram of FIG. 2 illustrates a memory access to synchronous DRAM (SDRAM); however, similar memory accesses apply to asynchronous DRAM as well.

As used herein, signal named followed by a "#" are low asserted signals. Thus, CS# indicates a signal that is asserted with a low voltage signal and CS indicates a signal that is asserted with a high voltage signal. While some signals described herein are low asserted signals, the description applies equally to corresponding high asserted embodiments.

At time $t_1$ the chip select signal (CS#) is asserted to select the specific memory chip corresponding to a memory location to be accessed. The row address strobe (RAS#) signal is also asserted at $t_1$ to activate the row of memory corresponding to the memory location to be accessed. The address (ADDR) signals indicate the row of memory that is to be accessed. Time $t_1$ is the activation of the row of memory to be accessed.

At time $t_2$, the CS# signal is asserted again to select the memory chip corresponding to the memory location to be accessed. The synchronous column address strobe (CAS#) signal is asserted. The address signals indicate the column of memory that is to be accessed.

At time $t_2$, the memory location corresponding to the row and column addresses indicated at times $t_1$ and $t_2$, respectively is accessed. Thus, time $t_2$ is the memory access. If the memory access is a write, the write enable (WE#) signal is asserted (not shown in FIG. 1). If the memory access is a read, the WE# signal is not asserted.

Time $t_3$ is a precharge of the memory bank that corresponds to the memory location accessed at $t_2$. In one embodiment, the WE#, CS#, RAS#, and CAS# signals are asserted at $t_3$ to indicate a precharge. Alternatively, other signal combinations can be used to indicate a precharge.

Figure 3:
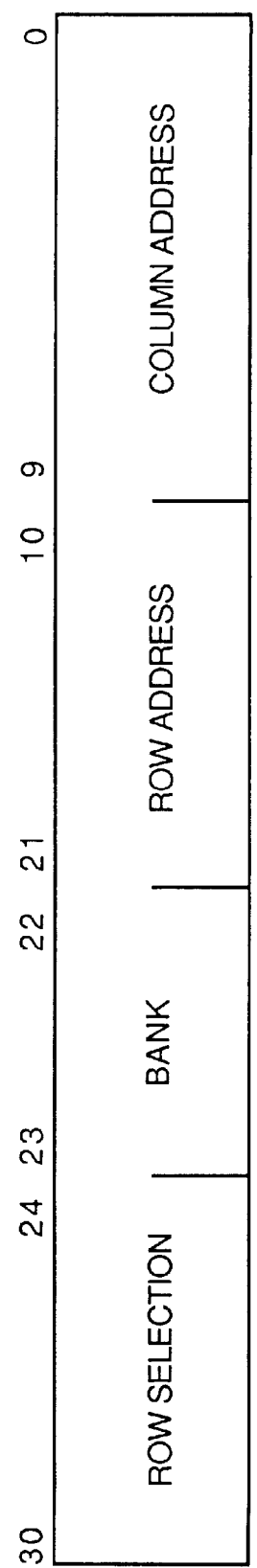
FIG. 3 is a logical address for accessing a location in memory.

FIG. 3 is a logical address for accessing a location in memory. The description of FIG. 3 assumes a memory sub-system having multiple banks of memory. In one embodiment, rows within the memory sub-system are not required to have an equal number of banks.

In one embodiment bits 0–9 are used to identify a target column with in a memory chip corresponding to a memory location to be accessed during $t_2$ of FIG. 2. Bits 10–21 are used to identify a target row within a memory chip corresponding to the memory location to be accessed during t1 of FIG. 2. The intersection of the row and column is the memory location to be accessed. In alternative embodiments, the row and column address can be different sizes.

In one embodiment bits 22 and 23 indicate the address of a bank within a particular row of the memory sub-system. Each row of the memory sub-system can have zero, two or four banks. Bits 24–30 are used for row selection, which identifies a row of memory devices within the memory sub-system. In contrast to the row selection bits that address a row of memory devices within the memory sub-system, the row address bits (10–21) are used to select a row of memory locations within a bank of memory.

Figure 4:
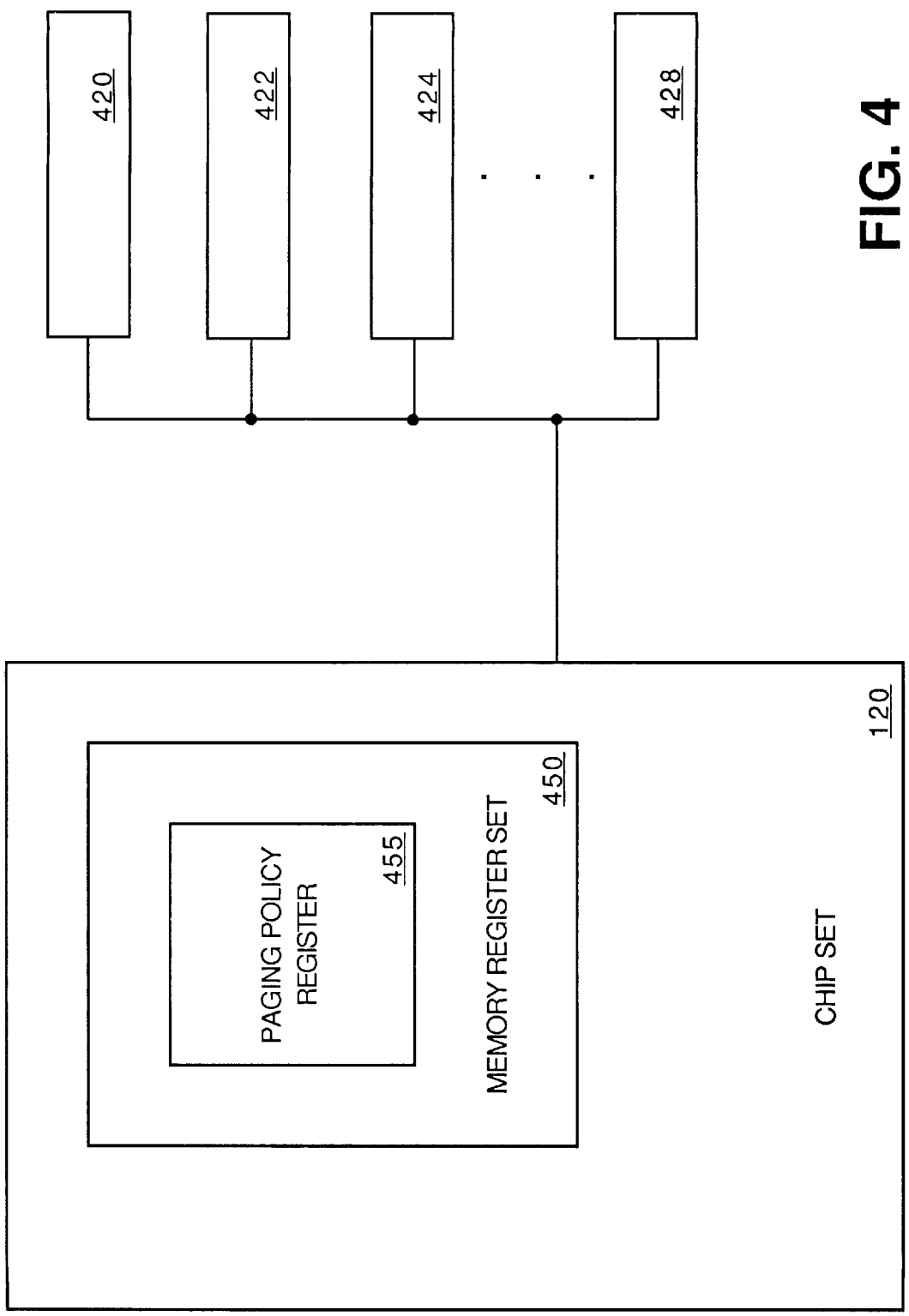
FIG. 4 is a block diagram of components for accessing DRAM.

FIG. 4 is a block diagram of components for accessing DRAM. In one embodiment, chip set 120 includes memory register set 450. Memory register set 450 includes 32 registers configured to maintain 32 banks of memory open simultaneously; however, any number of registers and any number of open banks of memory can be supported for use with the present invention.

In one embodiment memory register set 450 includes paging policy register 455 that determines a DRAM precharge policy. Paging policy register 455 includes a precharge control field that determines the action taken when a page miss occurs. The format and functionality of paging policy register 455 is described in greater detail below.

Chip set 120 is coupled to multiple rows of memory devices (e.g., 420, 422, 424 and 428). In one embodiment, 8 rows of memory having zero, two or four banks each can be supported. Alternatively, a different number of rows can be supported with an appropriate number of registers in memory register set 450. In one embodiment, each row of memory devices is individually evaluated by chip set 120 to determine the number of banks per row such that the different rows of memory can contain varying numbers of memory devices.

Chip set 120 and registers of memory register set 450 operate together to support multiple open banks of memory. When a page miss occurs, a bank of memory is closed in order to open a new bank of memory that includes the target address of the operation that caused the page miss. In order to reduce latency as compared to a scheme such as least-recently used (LRU), paging policy register 455 is used to selectively precharge (close) a bank of memory that is less likely to be used in the future.

Figure 5:
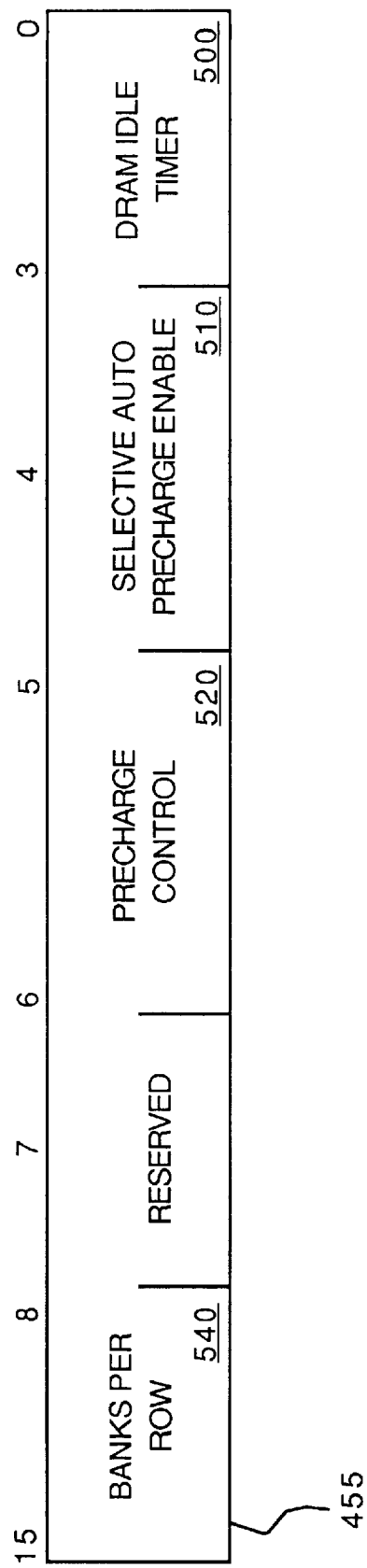
FIG. 5 is one embodiment of a paging policy register.

FIG. 5 is one embodiment of a paging policy register. In one embodiment paging policy register 455 is a 16-bit register; however, the size can be modified based on the number of banks supported as well as other features of the DRAM sub-system used therewith. Paging policy register 455 provides a predetermined bank closure policy that precharges banks selectively.

Bits 0–3 are DRAM Idle Timer (DIT) bits 500 that are used to determine the number of clock cycles during which the DRAM controller remains in the idle state before precharging all banks of a memory row with Precharge All command. The Precharge All command causes all banks of a selected memory row to be precharged. In one embodiment, the banks of the selected memory row are in an idle state after the Precharge All command has been completed. The following table describes one embodiment of DIT bits 500.

| DIT | Idle clocks before Precharge All Command |
|---|---|
| 0000 | 0 |
| 0001 | 2 |
| 0010 | 4 |
| 0011 | 8 |
| 0100 | 10 |
| 0101 | 12 |
| 0110 | 16 |
| 0111 | 32 |
| 1XXX | Pages are not closed for idle condition |

Bit 4 is the Selective Auto Precharge Enable (SAPEN) bit 510. In one embodiment if SAPEN bit 510 is set, selective automatic precharge functionality is enabled. If SAPEN bit 510 is not set, selective automatic precharge functionality is not enabled. Thus, if chip set 120 is used with DRAM that does not support automatic precharge commands, automatic precharge functionality can be disabled.

Bits 5–6 are the Precharge Control (PCCON) bits 520. In one embodiment, PCCON bits 520 are used to determine the action taken when a page miss occurs. The following table describes the actions taken on a page miss based on PCCON bits 520.

| PCCON | Action |
|---|---|
| 00 | Issue Precharge All command |
| 01 | Precharge bank targeted by the page miss cycle |
| 10 | If the page miss cycle is not the first cycle following an arbitration switch then precharge only the bank targeted by the page miss cycle. Otherwise issue Precharge All command |
| 11 | Reserved |

Bit 7 is reserved and bits 8–15 are the Banks Per Row (BPR) bits 540. In one embodiment, each bit within BPR 540 corresponds to one row of the memory array (e.g., 420,422,424 and 428 of FIG. 4). Each bit indicates whether the associated row has a device with a two-bank implementation or a four-bank implementation.

In one embodiment, selected banks within a selected row of memory can be precharged as a result of a page miss or other event. For example, if an active process accesses a particular bank within a row of memory and a second process accesses a second bank within the same row of memory, two banks within the row of memory are open simultaneously. If a page miss occurs and a bank of memory is closed to open a new bank of memory, the second bank of memory can be closed by precharging that bank only rather than closing the first bank or closing both banks with a Precharge All operation. Thus the first bank of memory that is accessed by the active process remains open so that the bank is not reopened upon the next memory access by the active process.

In one embodiment, the operation and/or process that caused a bank to be opened is used to determine which open bank of memory is closed in order to open a new bank of memory. For example, banks that are open because of a high latency operations, such as a posted write, are precharged so that banks that are open for lower latency operations and/or processes remain open. Thus, banks of memory that are more likely to be accessed in the future can remain open while banks that are less likely to be accessed in the future are closed when a new bank of memory is opened.

In one embodiment, pages that are accessed by I/O devices or processor posted writes are automatically precharged. Because processor read operations are likely to follow the I/O device access and/or posted writes, automatically precharging banks allows earlier access to memory banks by subsequent operations. Such an embodiment can improve overall memory sub-system performance.

The following table provides one embodiment of memory operations suitable for use with the present invention. Read and Write operations are provided to contrast Read With Auto Precharge and Write With Auto Precharge, respectively. In the following table, A10 and A11 are bits 10 and 11 of the ADDR signals, respectively. Similarly, A9–A0 are bits 9–0 of the ADDR signals. Low and High signal levels are represented by "L" and "H" respectively, valid data is represented by "V" and "X" represents a don't care condition.

| Operation | CS# | RAS# | CAS# | WE# | A11 | A10 | A9–A0 |
|---|---|---|---|---|---|---|---|
| Read | L | H | L | H | V | L | V |
| Read with Automatic Precharge | L | H | L | H | V | H | V |
| Write | L | H | L | L | V | L | V |
| Write with Automatic Precharge | L | H | L | L | V | H | V |
| Bank Activate | L | L | H | H | V | V | V |
| Precharge Select Bank | L | L | H | L | V | L | X |
| Precharge All Banks | L | L | H | L | X | H | X |

The operations described above allow a computer system or other device in which multiple banks of memory are used to selectively precharge banks of memory based on a predetermined bank precharge (closure) policy. By using the various commands described above, a bank precharge policy can be fine tuned for a particular system and/or environment. Thus, the present invention provides precharge policies that improve performance of a memory sub-system.

Chip set 120 issues the commands described above to control the memory sub-system. By selectively issuing Read, Read with Automatic Precharge, Write, Write with Automatic Precharge, Precharge Select Bank, and Precharge All Banks operations, chip set 120 can manage the memory sub-system with lower overhead and higher throughput as compared to a memory sub-system not supporting all of the operations described above.

In one embodiment, the source of a memory access is used to determine whether the access is terminated with an automatic precharge. The state of a DRAM arbiter can also be used to determine whether an access should be terminated with an automatic precharge.

In the foregoing specification, the present invention has been described with reference to specific embodiments thereof. It will, however, be evident that various modifications and changes can be made thereto without departing from the broader spirit and scope of the invention. The specification and drawings are, accordingly, to be regarded in an illustrative rather than a restrictive sense.

What is claimed is:

1. A method comprising:
   opening a bank of memory in a memory sub-system;
   accessing a memory location in the bank of memory; and
   precharging the bank of memory selectively and automatically based, at least in part, on a type of access to the memory location.

2. The method of claim 1 further comprising automatically precharging one or more additional banks of memory in a common row with the bank of memory.

3. The method of claim 1 further comprising automatically precharging one bank of a row of memory based, at least in part, on an operation that caused a page miss in the memory sub-system.

4. The method of claim 1 further comprising:
   determining a bank of memory accessed by a high latency process; and
   precharging the bank of memory accessed by the high latency process in response to a page miss.

5. The method of claim 1 wherein automatic precharge is determined based, at least in part, on an operation causing the memory access.

6. An apparatus comprising:
   means for opening a bank of memory in a memory sub-system;
   means for accessing a memory location in the bank of memory; and
   means for precharging the bank of memory selectively and automatically based, at least in part, on a type of access to the memory location.

7. The apparatus of claim 6 further comprising means for automatically precharging one or more additional banks of memory in a common row with the bank of memory.

8. The apparatus of claim 6 further comprising means for automatically precharging one bank of a row of memory based, at least in part, on an operation that caused a page miss in the memory sub-system.

9. The apparatus of claim 6 further comprising:
   means for determining a bank of memory accessed by a high latency process; and
   means for precharging the bank of memory accessed by the high latency process in response to a page miss.

10. The apparatus of claim 6 further comprising means for automatically precharging the bank of memory based, at least in part, on an operation causing the memory access.

11. A system comprising:
    a bus;
    a processor coupled to the bus, the processor to issue operations;
    a chip set coupled to the bus, the chip set to receive one or more operations issued by the processor, the chip set to cause memory operations issued by the processor to be performed; and
    a memory sub-system coupled to the chip set, the memory sub-system to receive memory operations from the chip set, the memory operations to cause a bank of the memory within the memory sub-system to be selectively and automatically precharged based, at least in part, on a type of access to the memory location.

12. The system of claim 11 wherein the bank of memory is automatically precharged in response to a page miss.

13. The system of claim 11 wherein the bank of memory that is automatically precharged was accessed by a high latency process.

14. The system of claim 11 wherein the chip set comprises a memory register set having multiple registers to support multiple open banks of memory.

15. The system of claim 11 wherein automatic precharge is determined based, at least in part, on an operation causing a memory access.

16. An apparatus having:
    an interface to receive memory operations; and
    a control circuit coupled to the interface, the control circuit to selectively and automatically precharge banks of a memory sub-system based, at least in part, on a type of access to a memory location.

17. The apparatus of claim 16 wherein the bank of memory is automatically precharged in response to a page miss.

18. The apparatus of claim 16 wherein the bank of memory that is automatically precharged was accessed by a high latency process.

19. The apparatus of claim 16 wherein the control circuit comprises a memory register set having multiple registers to support multiple open banks of memory.

20. The apparatus of claim 16 wherein automatic precharge is determined based, at least in part, on an operation causing the memory access.

* * * * *

UNITED STATES PATENT AND TRADEMARK OFFICE
CERTIFICATE OF CORRECTION

PATENT NO. : 6,181,619 B1
DATED : January 30, 2001
INVENTOR(S) : Bogin et al.

It is certified that error appears in the above-identified patent and that said Letters Patent is hereby corrected as shown below:

Column 3,
Line 29, delete "125", insert -- 120 --.

Signed and Sealed this

First Day of October, 2002

Attest:

Attesting Officer

JAMES E. ROGAN
Director of the United States Patent and Trademark Office